United States Patent [19]
Coldren

[11] 4,327,340
[45] Apr. 27, 1982

[54] SURFACE WAVE RESONATOR CASCADE

[75] Inventor: Larry A. Coldren, Holmdel, N.J.

[73] Assignee: Bell Telephone Laboratories Incorporated, Murray Hill, N.J.

[21] Appl. No.: 80,086

[22] Filed: Sep. 28, 1979

Related U.S. Application Data

[63] Continuation-in-part of Ser. No. 943,681, Sep. 19, 1978, abandoned.

[51] Int. Cl.³ .................. H03H 9/64; H03H 3/10; H03H 9/25; G02B 5/14
[52] U.S. Cl. .................... 333/195; 333/155; 333/196; 350/96.12
[58] Field of Search ............... 333/193–196, 333/150–155; 310/313; 331/107 A; 350/96.12

[56] References Cited
U.S. PATENT DOCUMENTS 4,013,983  3/1977  Hartemann ................ 333/195
4,027,946  6/1977  Tsai ........................ 350/96.12
4,155,056  5/1979  Cross et al. ............... 333/195

*Primary Examiner*—Marvin L. Nussbaum
*Attorney, Agent, or Firm*—Michael B. Einschlag

[57] ABSTRACT

Grating resonators for surface acoustic waves or surface optical waves are coupled in cascade via a track changer external to the resonator cavities. At least one grating of each resonator is partially transmissive in the resonant band, allowing the interchange of energy therebetween via the track changer. The track changer is comprised of either two or three reflective racks angled such that the energy reflected therein propagates along zero-temperature-coefficient paths. The three-rack, three-bounce U-path filter used as a track changer minimizes resonant energy losses due to variations in reflected wave angles from their designed values.

22 Claims, 15 Drawing Figures

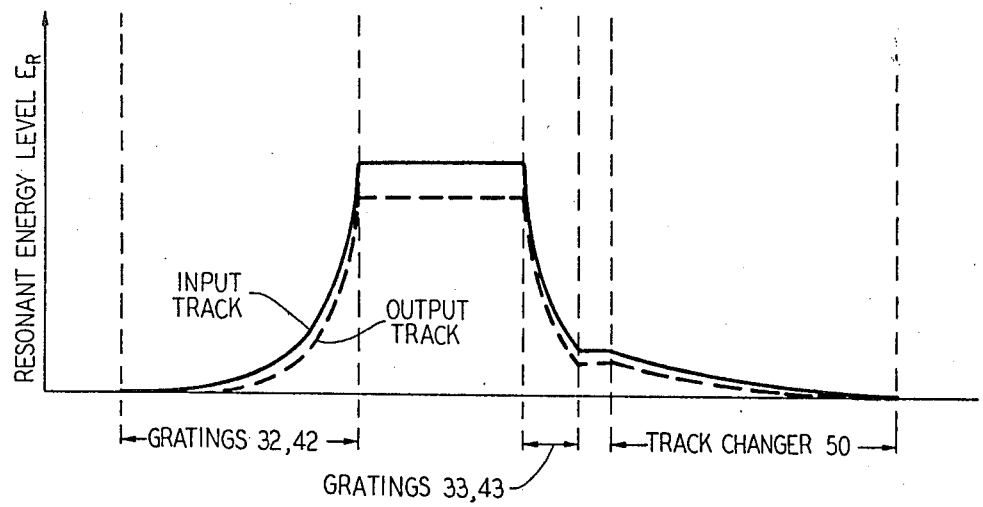
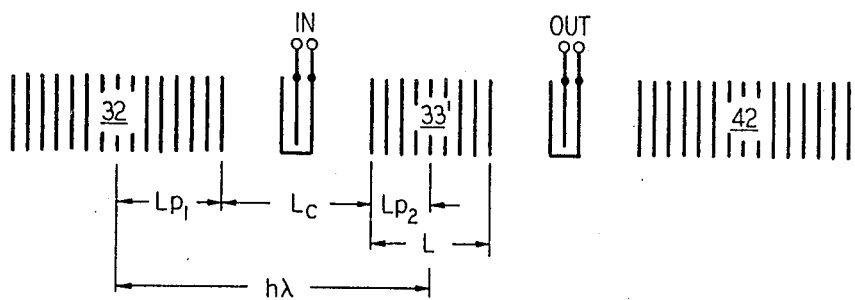
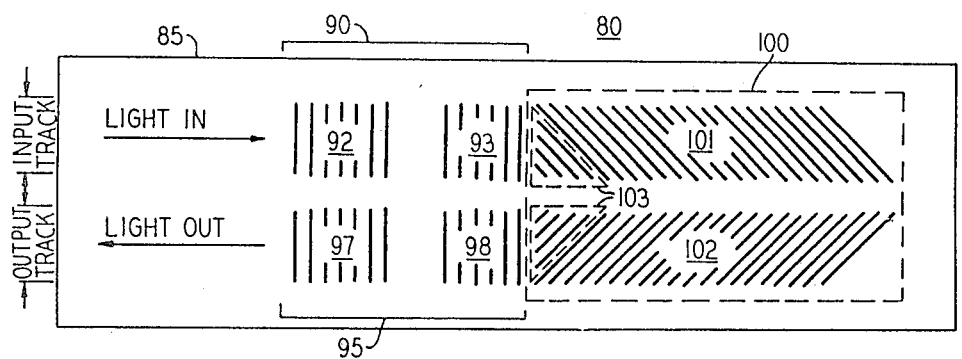

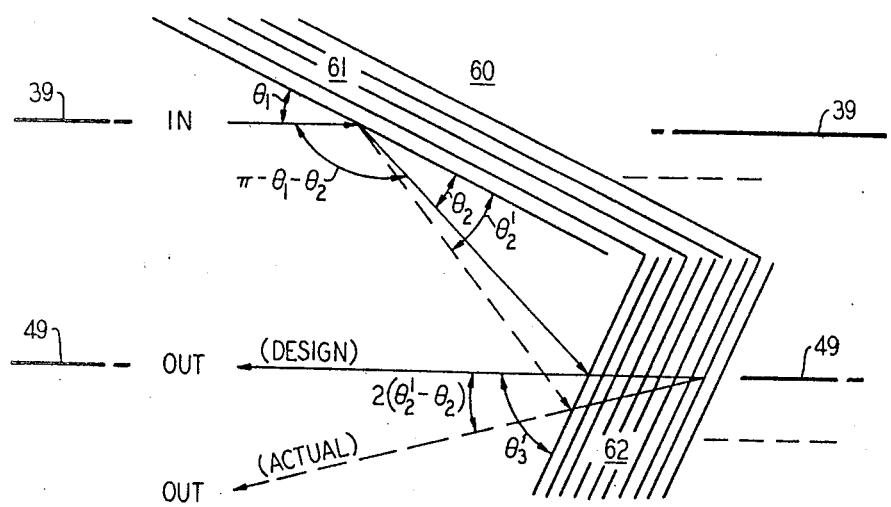
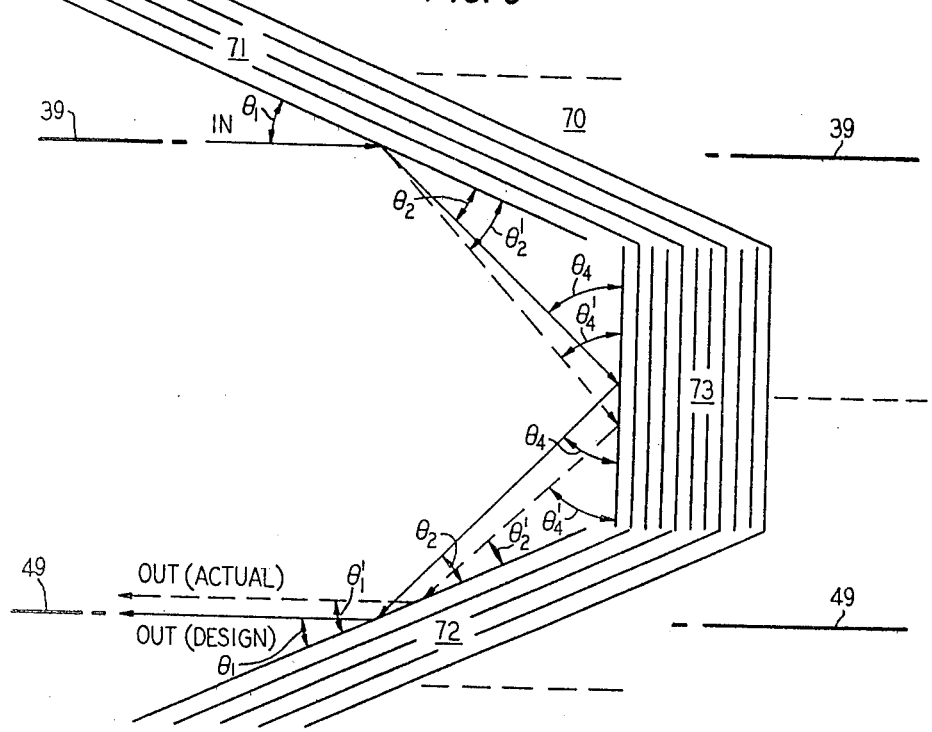

SURFACE WAVE RESONATOR CASCADE

BACKGROUND OF THE INVENTION

This application is a continuation-in-part of application Ser. No. 943,681 filed on Sept. 19, 1978, and now abandoned.

The present invention relates to surface wave devices and, more particularly, to surface wave filters that use cascaded grating resonators to provide a bandpass characteristic.

The fact that waves such as acoustic and optical waves will propagate on the surface of piezoelectric and other crystalline materials has been exploited in the prior art to provide a number of useful signal processing devices. For example, U.S. Pat. No. 3,886,504 issued May 27, 1975 to C. S. Hartmann et al discloses a grating resonator in which a surface wave generated in response to an electrical input signal is introduced into a resonating cavity defined by a pair of grating reflectors disposed on the crystalline wave propagation medium, or substrate. Most of the wave energy outside a relatively narrow band passes through the reflectors and out the ends of the device, while most of the energy within that band is reflected back into the cavity. Of this, only energy within an even narrower band actually resonates within the resonator. The resonant energy is coupled out of the cavity and reconverted to electrical form, providing an electrical passband filter characteristic.

The principles disclosed in the Hartmann et al patent are illustrated in a surface acoustic wave (SAW) context. These principles can also be applied, however, to the design of grating resonators for other types of surface waves, such as surface optical waves. A further teaching of the Hartmann et al patent is that two or more grating resonators can be connected in cascade. This provides the bandpass characteristic with steeper skirts and flatter passband response than a single-section resonator. Desirably, a grating resonator cascade should be compact and relatively inexpensive to manufacture, should have low passband insertion loss and adequate out-of-band suppression. A further desirable feature, at least for certain applications, is the ability to provide low-to-moderate filter Q's, i.e., relatively large fractional bandwidth. Numerous arrangements for cascading grating resonators—predominantly surface acoustic wave resonators—have been proposed in the art. Most of these, however, lack one or more of the above desirable properties.

For example, one way of connecting grating resonators in cascade is via electrical coupling in which as output transducer associated with one resonator is electrically connected to an input transducer associated with the next. Such an arrangement is shown in FIG. 2 of the Hartmann et al patent. However, electrical coupling on weak piezoelectrics such as the commonly used quartz will usually require the use of coupling networks between the resonators in order to achieve the desired coupling strength or tune the filter to a desired characteristic. The bulk, expense and power dissipation associated with the coupling network components—particularly inductors—as well as the manufacturing costs attendant to the physical interconnection and tuning of these networks renders the approach unattractive.

Grating resonators can also be cascaded via a monolithic electromechanical coupler. This may be multistrip coupler, as shown, for example in FIG. 4 of the Hartmann et al patent, or may be an untuned intercavity transducer pair. In this approach, applicable principally to SAW resonators, the electromechanical coupler converts wave energy in one resonator into electrical currents on the coupler fingers and thence back to wave energy in the other resonator. Advantageously, the coupler can be formed monolithically with the rest of the filter. However, the amount of coupling provided by either the multistrip coupler or the untuned transducer coupler is a direct function of the width thereof, and there may simply not be enough room in the resonator cavity to accommodate a wide multistrip or transducer coupler—often necessary when low filter Q is desired.

In accordance with a technique applicable to both acoustic and optical surface waves, it is also possible to couple resonant energy from one resonator to another in wave form, i.e., without intermediately converting it to electrical form as in the arrangements described above. For example, the resonators may be aligned such that their longitudinal axes lie in the same wave propagation track of the substrate, with an "inner" grating reflector which is partially transmissive in the resonant band being common to both resonators. Resonant energy in one resonator thus propagates out one end thereof and into one end of the other. Advantageously, this configuration allows the fraction of resonant energy coupled from one resonator to the next to be variable over a wide range, providing a wide range of filter Q. Unfortunately, the inner grating reflector becomes fully transmissive, or "transparent", at frequencies not far from the resonator passband, creating undesirable side lobes in the filter characteristic. The use of external electrical filter networks to prefilter, or "window", the resonant passband and thereby attenuate the out-of-band side lobes is, again, undesirable because of the added complexity and loss contributed by the external filter.

Various other arrangements have been proposed to provide the desired passband windowing. For example, U.S. Pat. No. 4,013,983 issued Mar. 22, 1977, to P. Hartemann, teaches the use of a frequency-selective track-changing element in the form of an angled reflective grating array to couple wave energy from an external transducer into the cascaded structure. The state of the art is such, however, that it is virtually impossible to design arrays of this type which will meet the stringent passband-loss requirements of many filter applications. A further source of passband loss, at least in SAW applications, is that SAW transducers are relatively inefficient in converting electrical energy to acoustic energy when they are disposed outside a resonator cavity.

A more efficacious frequency-selective track changing arrangement is disclosed in the commonly-assigned copending U.S. patent application of P. S. Cross and R. V. Schmidt, Ser. No. 827,576, filed Aug. 25, 1977, and now U.S. Pat. No. 4,155,056, issued May 15, 1979 where a combination of elements including weighted gratings and a multistrip coupler is used at both the input and output ports of the filter to provide an appropriate windowing of the resonant passband. This is a viable approach from an analytical standpoint. A significant limitation of this arrangement, however, is that it is relatively complex and that its fabrication requires precise tuning and matching of the input and output track-changing elements with each other and with the resonant structure itself. These considerations render the overall configuration expensive to fabricate.

U.S. Pat. No. 4,065,735 issued Dec. 27, 1977 to J. S. Palfreeman et al suggests a somewhat different technique for coupling resonant energy in one resonator into the other in wave form. Here the resonators are disposed in different acoustic wave tracks, with appropriately-angled, partially transmissive reflection gratings being disposed within the resonator cavities to couple energy between them. (See, e.g., col. 7, line 62 et seq of the cited patent.) My analysis of the structure proposed in the Palfreeman et al patent indicates that, because of a phase mismatch, a substantial amount of resonant energy coupled out of each cavity will not be captured by the other but, rather, will propagate out of the cascade altogether, resulting in substantial passband loss.

SUMMARY OF THE INVENTION

The principal object of the present invention is to provide an arrangement for cascading surface wave grating resonators which avoids the above-discussed and other limitations of prior art arrangements.

The cascaded grating resonator arrangement of the present invention is of the type in which surface wave energy in one resonator is coupled into the other in wave form, i.e., without being intermediately converted to electrical form, for example. As is known arrangements of this type, wave energy is coupled into and out of each resonator through at least one end thereof along its longitudinal axis by using resonator gratings which are partially transmissive in the resonant passband. In accordance with the present invention, however, the resonators are disposed on the surface wave propagation medium such that their longitudinal axes lie in different wave propagation tracks of the medium. Resonant energy is transferred from one resonator to the next via a frequency-selective track changer external to the resonator cavities, with the necessary out-of-band filtering being provided by the intercavity track changer. At the same time, the track changer can be relatively lossy without seriously reducing the cavity Q's. This is because in steady-state operation, substantially more of the energy in the resonant passband is contained within the cavities than in the external coupling path between them. Thus, even if a significant fraction of the energy introduced into the track changer is lost therein, that lost energy represents but a small fraction of the total resonant energy in the system. A further advantage for surface acoustic wave applications is that input and output transducers internal to the resonator cavities can be used. This provides improved impedance matching and rejection characteristics as compared to arrangements in which the transducers are external to the resonator cavities.

The track changer is illustratively comprised of at least first and second angled reflective grating arrays each comprised of a plurality of parallel grooves, or "lines" formed in the surface of the wave propagation medium. Wave energy entering the track changer from one resonator impinges upon the first, or input, array and is reflected to the second, or output array which, in turn, reflects the wave energy into the other resonator. Advantageously, such a track changer is inexpensively fabricated and, even though it is relatively lossy, the overall passband degradation attributable to the track changer is quite small, for the reason mentioned above.

In accordance with a feature of the invention, the angled arrays of the track changer may be angled such that energy propagates therein along zero-temperature-coefficient paths, advantageously minimizing temperature-dependent variations in the filter characteristic.

A potential problem with the above-described type of two-array track changer is that, for a number of reasons, the various surface wave reflection angles therein may differ slightly from their designed values when the filter is actually fabricated. As a result, energy may exit from the track changer not along the associated resonator axis, but at an angle thereto. This can result in substantial resonant energy loss.

This problem is substantially overcome in accordance with another feature of the invention by utilizing a three-bounce U-path filter as the track changer. The track changer is provided with a third, intermediate reflective array off of which the energy is intermediately reflected on its path between the input and output arrays as previously described. The third array is oriented with respect to the crystal axes of the wave propagation medium such that the angles of incidence and reflection for waves incident thereon are assured to be equal. This being so, any variation in reflection angle off, for example, the input array results in a compensating variation in reflection angle off the output array. The exiting surface wave, although not assured to be centered on the associated resonator longitudinal axis, is now at least assured to be parallel thereto. Accordingly, much less resonant energy is lost than would be lost in a two array track changer having the same reflection angle variation.

BRIEF DESCRIPTION OF THE DRAWING

In the drawing,

FIG. 3 is an energy distribution graph helpful in understanding the operation of the filter of FIG. 1;

FIG. 4 is a simplified on-resonance equivalent structure of the filter of FIG. 1, helpful in explaining an exemplary design procedure therefor;

FIGS. 5 and 6 respectively depict first and second alternative embodiments for the track changer used in the filter of FIG. 1;

FIG. 7 depicts a surface optical wave bandpass filter comprised of a pair of optical grating resonators connected in cascade in accordance with the invention;

DETAILED DESCRIPTION

Figure 1:
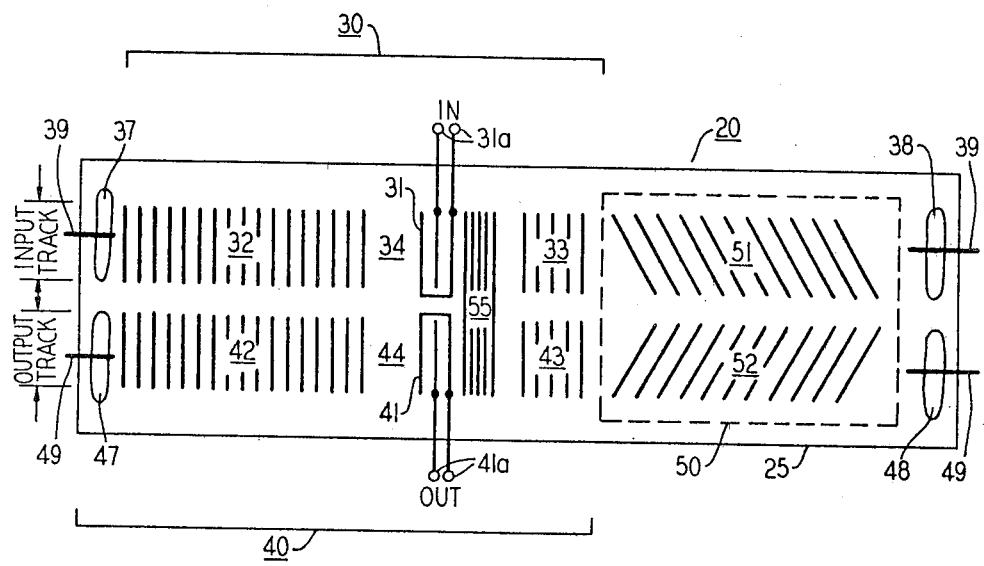
FIG. 1 depicts a surface acoustic wave (SAW) bandpass filter comprised of a pair of SAW grating resonators connected in cascade in accordance with the invention.

FIG. 1 depicts a bandpass filter 20 comprised of of a pair of surface wave resonators 30 and 40—illustratively surface acoustic wave (SAW) resonators—respectively disposed in input and output tracks on a wave propagation medium, or substrate, 25. Resonator 30, includes an input transducer 31 disposed in a resonating cavity 34 defined by a pair of SAW reflectors 32 and 33. Resonator 40 correspondingly includes an output transducer 41 disposed in a resonating cavity 44 defined by a pair of SAW reflectors 42 and 43. The transducers and reflectors are of conventional design, each illustratively being comprised of a plurality of parallel metallic strips disposed on substrate 25. The substrate itself is comprised of a material on which surface acoustic waves will propagate, illustratively a piezoelectric such as ST-cut, X propagating quartz. In accordance with the present invention, filter 20 further includes a track changing element 50 external to cavities 34 and 44 which couples energy between resonators 30 and 40.

In operation, transducer 31 converts electrical input signals applied between input terminals 31a into acoustic wave energy. This energy propagates to the left and to the right along longitudinal axis 39 of resonator 30 out to reflectors 32 and 33. The latter are substantially invisible to energy outside of a predetermined frequency band, hereinafter referred to as the "grating stopband." Thus, most of the energy outside of that band propagates right through reflectors 32 and 33 into acoustic absorber 37 and track changer 50, respectively.

Energy which is within the grating stopband, however, is reflected back into cavity 34. In particular, reflector 32 is designed so as to reflect as much of the energy within the grating stopband as possible back into the cavity. Reflector 33, by contrast, is partially transmissive in the grating stopband. Thus, in addition to the above-mentioned out-of-band energy, a predetermined fraction of the energy within the grating stopband which propagates into reflector 33 continues into track changer 50. The rest of that grating stopband energy is reflected to the left back into cavity 34.

Track changer 50 is a two-port device, illustratively comprised of a known arrangement of two angled reflection grating arrays 51 and 52. Arrays 51 and 52 are disposed in the input and output tracks, respectively. Each array is comprised of a respective region of substrate 25 in which a plurality of parallel grooves is formed. Arrays 51 and 52 each have approximately the same stopband as reflectors 32 and 33. Thus, most of the energy outside of the grating stopband propagating into array 51 from resonator 30 continues in the input track and is ultimately absorbed by absorber 38. Most of the energy within the grating stopband, however, is reflected in a generally downward direction toward array 52. The latter in turn, reflects the stopband energy received from array 51 to the left into the output track.

Reflectors 42 and 43 of resonator 40 are substantially identical to reflectors 32 and 33, respectively. In particular, reflector 43 is partially transmissive in the grating stopband. Thus, a predetermined fraction of the energy in that band introduced into the output track from track changer 50 propagates to the left along longitudinal axis 49 of resonator 40 through reflector 43 into cavity 44. The remainder is reflected back into track changer 50. Of the grating stopband energy which does pass through reflector 43, a portion is retained in cavity 44 via multiple reflections between reflectors 42 and 43, a portion is reconverted to electrical form by transducer 41 on output terminals 41a, and a portion is coupled back into track changer 50 via, again, reflector 43. Track changer 50 operates bi-directionally. Thus, any out-of-band energy propagating into array 52 from resonator 40 mostly continues in the output track and is absorbed in absorber 48. Energy within the grating stopband, however, is reflected to array 51 and thence into the input track toward resonator 30. Out-of-band energy propagating to the left within resonator 40 passes through grating 42 into absorber 47.

Figure 2:
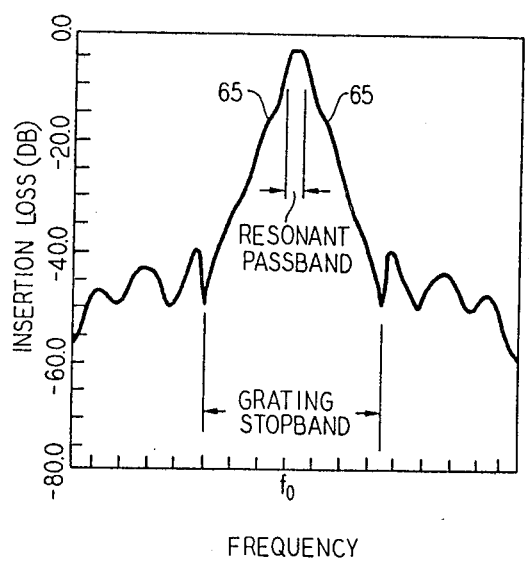
FIG. 2 shows a tyhpical bandpass characteristic of the filter of FIG. 1.

The above-described bi-directional flow of SAW energy within and between resonators 30 and 40 sets up standing surface acoustic wave resonances at frequencies for which various round-trip paths in the system are equal to an integral number of wave periods. Resonance is strongest within one particular, narrow frequency band encompassed by the grating stopband, hereinafter alternately referred to as the "resonant band," "resonant passband" or, more simply, "passband." The overall electrical characteristic of filter 20 is thus that of a passband filter. FIG. 2 shows a typical such characteristic for the two-resonator cascade of FIG. 1.

A significant aspect of the present invention is that it provides a SAW resonator cascade in which the input and output transducers are retained within the resonator cavities. This advantageously provides improved transducer impedance matching and rejection characteristics over resonator cascades having transducers external to the resonator cavities. A further significant aspect of the present invention—applicable to both acoustic and optical embodiments—is that the track changer can have appreciable insertion loss within the resonant band without seriously reducing the cavity Q's. This aspect of the invention may be appreciated from a consideration of FIG. 3 which shows the steady-state distribution of resonant energy within the input and output tracks of filter 20. Note that the resonant energy resident in track changer 50 represents but a small fraction of the total resonant energy in the system. Thus, even if the insertion loss of track changer 50 is relatively high in the resonant band, the actual amount of resonant energy lost therein likewise represents but a small fraction of the total resonant energy in the system.

Thus, on the one hand, the present invention retains the above-described advantages of coupling wave energy between resonators directly, i.e., without intermediately converting the wave energy to electrical form, for example. On the other hand, the invention avoids many of the drawbacks of prior art direct coupling arrangements.

An illustrative procedure for determining appropriate parameter values for the SAW resonator cascade of FIG. 1 to meet desired design criteria will now be presented. The first step is to calculate or measure the unloaded Q, $Q_u$, for the cavities in accordance with known techniques. See, e.g., L. A. Coldren, "Characteristics of Surface Acoustic Wave Resonators Obtained from Cavity Analysis," *IEEE Trans. SU*, Vol. SU-24, pp. 212–217, May 1977. The parameter $q_o$, which is the unloaded Q, normalized to the filter Q, is then given by $$q_o = Q_u/Q_F$$

where
$Q_F = f_o/\Delta f$,
$f_o$ = desired filter center frequency,
$\Delta f$ = desired 3-DB frequency bandwidth.

Knowing $q_o$ and the type of filter response desired, such as Butterworth, Chebyschev, equal ripple, etc., the normalized intercavity coupling, k, is determined by table look-up in a standard filter design handbook such as A. I. Zverev, *Handbook of Filter Synthesis,* New York, John Wiley & Sons, 1967.

The next intercavity coupling transmission level $T_c$, is computed next. This parameter is given by $$T_c = (2\pi n_k/Q_F), \quad (1)$$

where n is the effective cavity length, herein assumed to be the same for each cavity.

For purposes of determining n, track changer 50 is assumed to be fully transparent to energy in the resonant band. Resonant energy in resonator 30, for example, then "sees" gratings 33 and 43 as one continuous grating. As shown in FIG. 4, the resonator cascade of FIG. 1 can thus be redrawn for purposes of analysis as a linearly coupled acoustic cascade, with gratings 33 and 43 replaced by a single grating 33'. The length of grating 33' is L. The cavity length n is expressed for resonator 30 as $$n\lambda = (L_c + L_{p1} + L_{p2}) \quad (2)$$

where
$\lambda$ = resonant wavelength
$L_c$ = distance between the inner edges of gratings 32 and 33'
$L_{p1}$ = equivalent penetration depth of grating 32
$L_{p2}$ = equivalent penetration depth of grating 33'.

$L_c$ is selected on the basis of known SAW resonator design criteria. See, for example, D. T. Bell et al, "Surface Acoustic Wave Resonators," *Proc. IEEE,* Vol. 64, pp. 711–721, May 1976.

The grating penetration depths $L_{pi}$, i=1,2, are given by, $$L_{pi} = \tan h \, \kappa L_i/2\kappa, \quad (3)$$

where $\kappa$ is the normalized impedance discontinuity for the grating. (See, for example, P. S. Cross et al, *Bell System Tech. Jrnl.,* Vol. 56, pp. 1447–1482, October 1977.) As previously described, grating 32 is made sufficiently long that substantially all of the stopband energy impinging thereon is reflected back into the cavity. In this case, $\tan h \, \kappa L_1 \approx 1$, and $L_{p1} \approx \frac{1}{2}\kappa$. For the partially transmissive gratings 33', $L_{p2} = \tan h \, \kappa L/2\kappa$, so that $$n\lambda = L_c + (1 + \tan h \, \kappa L)/2\kappa. \quad (4)$$

Furthermore, from Cross et al cited above we find the transmission of grating 33' is given by $$T_c = \sec h \, \kappa L. \quad (5)$$

Therefore, substituting back into Eq. (1) we find, $$\sec h \, \kappa L = (2\pi k/\lambda Q_F) \, [L_c + (1 + \tan h \, \kappa L)/2\kappa]. \quad (6)$$

which can be solved for L, the length of the coupling grating 33' needed to provide the required $T_c$. Gratings 33 and 34 of FIG. 1 will then be given a length L/2.

Transducers 31 and 41 can now be designed. The important parameter is the magnitude of their respective electromechanical conversion efficiencies, given by the absolute square of the scattering coefficients $$|S_{13}(f)|_{in}^2 \text{ and } |S_{13}(f)|_{out}^2,$$

given by $$|S_{13}(f)|_{in}^2 = \frac{\pi n}{Q_F}\left(\frac{1}{q_{in}} - \frac{1}{q_o}\right)$$

$$|S_{13}(f)|_{out}^2 = \frac{\pi n}{Q_F}\left(\frac{1}{q_{out}} - \frac{1}{q_o}\right)$$

where $q_{in}$ and $q_{out}$ are the normalized loaded Q of the input and output cavities which again, can be determined by table look-up. The parameter n is given by Eq. (4). With $|S_{13}(f)|_{in}^2$ and $|S_{13}(f)|_{out}^2$ determined, the design of transducers 31 and 41 can be completed. See, for example, W. R. Smith, et al, *IEEE MTT Trans.,* Vol. MTT-17, pp. 865–872, 1969.

The remaining task is to design track changer 50. The track changer transmission characteristic, $F_{12}(f)$, should be as lossless as possible in the resonant passband ($|F_{12}(f_o)| \approx 1$). In addition, the requirements of the particular application will dictate that the track changer provide a particular amplitude level OL at a particular out-of-band frequency $f_{OL}$. Assuming gratings 33 and 34 to be transparent at $f_{OL}$, this design parameter, in turn, dictates the magnitude of the transfer characteristic of the track changer at $f_{OL}$ to be $$|F_{12}(f_{OL})| = \frac{OL}{|S_{13}(f_{OL})|_{in} |S_{13}(f_{OL})|_{out}}.$$

A track changer meeting the above criteria can be arrived at using standard design techniques. See, for example, R. C. Williamson, *IEEE Proc.,* Vol. 64, pp. 702–710, 1976.

Track changer 50 is positioned on substrate 25 such that the total path length for resonant energy from the right hand edge of grating 33, through the track changer to the right hand edge of grating 43 is an integral number of wavelengths plus one-quarter of a wavelength. This minimizes the possibility of standing wave resonances occurring in the resonant passband within the track changer. A resonance does occur at frequencies for which the length of the above-traced path is equal to an integral number of wavelengths. This resonance creates a small bump on each side of $f_o$ in the filter transfer characteristic, as indicated at 65 in FIG. 2. These can, however, be minimized by designing track changer 50 in accordance with known design techniques so that it has as narrow a bandpass characteristic as possible.

It should be appreciated from the foregoing that many simplifying assumptions were made to facilitate calculations of the various design parameters of the resonator cascade of FIG. 1. The calculated values will, in general, provide a design that comes within, perhaps 10 percent of the insertion loss, bandwidth, rejection, etc., specifications. If more precise adherence to specifications is required, the calculated values can be used as a starting point in "tightening up" the design using more rigorous analysis equations such as taught by R. L. Rosenberg and L. A. Coldren in 1977 *Ultrasonics Symp. Proc.,* IEEE Cat. No. 77CH1264-1 SU, pp. 882–887, 1977.

Final, post-manufacture trimming of the passband characteristic is facilitated by an intercavity electromechanical coupler, illustratively multistrip coupler 55. Like track changer 50, multistrip coupler 55 also couples resonant energy between cavities 34 and 44. (Its effect on the resonant energy levels within the cavities is ignored for simplicity in FIG. 3.) The multistrip coupler, however, is comprised of a plurality of metallic fingers rather than grooves formed in the substrate surface. These metal fingers are more easily removed or severed than the grooves of arrays 51 and 52, thereby facilitating the post-manufacture trimming. The intercavity coupling provided by multistrip coupler 55 may be, for example, about 10 percent of that provided by track changer 50. The presence of the multistrip coupler can be taken into account into the above-described design procedure by determining the final value of L in Eq. (6) using a slightly smaller value of $T_c$ than the design procedure yields, the remainder of the intercavity coupling then being taken up by the multistrip coupler. If desired, multistrip coupler 55 can be weighted in the manner taught in my copending U.S. patent application, "Improved Surface Acoustic Wave Multistrip Coupler," Ser. No. 877,838, filed Feb. 15, 1978, and now U.S. Pat. No. 4,166,987, issued Sept. 4, 1979.

In general, the phase velocity of SAW energy is temperature-dependent for most directions of SAW propagation relative to the crystal axes. This dependence can cause severe variation of SAW resonator parameters—notably center frequency—with temperature. However, crystalline materials used in SAW devices, such as ST-cut, X-propagating quartz, typically have at least one zero-temperature coefficient direction, i.e., a direction for which the SAW phase velocity is temperature-independent. In general, the resonator axes will be aligned in this direction, avoiding the above-mentioned problem.

Many materials have at least a second zero-temperature-coefficient direction. This direction, however, is typically not perpendicular to the first. Thus if, as is conventional, arrays 51 and 52 of track changer 50 are disposed at approximately 45 degree angles to the directions of input and output energy propagation, SAW energy reflected to array 52 from array 51 will follow a path for which the temperature coefficient is not zero. In the present application, the resulting variation with temperature of the SAW phase velocity within the track changer can cause a first-order variation in the shape—although not the location—of the filter passband characteristic. Thus, use of a track changer in the form shown in FIG. 1 for track changer 50 can introduce an undesired element of variability with temperature into the filter characteristic.

This problem is overcome in accordance with a feature of the invention by angling the arrays of the track changer such that SAW energy propagating therein follows a second zero-temperature-coefficient path of the substrate. A track changer 60 embodying this feature of the invention is shown in FIG. 5. Input array 61 of track changer 60 is disposed at an angle $\theta_1$ to longitudinal axis 39 of resonator 30, and thus, to energy propagating therefrom. SAW phase velocity varies not only with temperature, but also with the orientation of the SAW propagation path with respect to the substrate crystal axes. As a result, the angle of reflection $\theta_2$ off array 61 is, in general, different from $\theta_1$. As is illustrated in FIG. 5 for energy reflecting off the first groove of array 61, the angles $\theta_1$ and $\theta_2$ are selected such that the reflected SAW energy propagates to the output array 62 along a zero-temperature coefficient path. Array 62, in turn, is disposed at an angle $\theta_3$ to longitudinal axis 49 of resonator 40 so that the SAW energy received from array 61 is reflected along that axis into resonator 40.

Due to the inherent symmetry of the device, energy from resonator 40 reflected from array 62 to array 61 will propagate along the same zero-temperature-coefficient direction.

A further problem associated with SAW track changers is not, unfortunately, remedied by the arrangement of FIG. 5. There is always some uncertainty as to the precise value of the angle $\theta_2$ due, for example, to the fact that the velocity characteristic of a given substrate material will vary somewhat from one sample of the material to the next. Even in a given sample, the velocities, and hence reflection angles, can be known only to a finite degree of accuracy. Further uncertainty in the reflection angles may result from variations from one manufactured filter to the next in the orientation of the filter components—including the track changer—with respect to the crystal axes. Thus, even though the designed angle of reflection off array 61 is one angle, $\theta_2$, the actual value in a particular manufactured filter may be a different angle, $\theta_2'$. As seen in FIG. 5, the angle error $(\theta_2 - \theta_2')$ is doubled upon reflection off array 62. The track changer output wave thus enters resonator 40 at an angle to longitudinal axis 49 thereof. This can result in significant resonant energy loss.

This problem is overcome by utilizing a three-bounce U-path filter for the track changer. A third reflective array is introduced into the track changer to provide U-path filter 70 shown in FIG. 6. U-path filter 70 includes three arrays 71, 72 and 73. When utilized as a track changer, the grooves of input array 71 and output array 73 are disposed at an angle $\theta_1$ to the longitudinal axes 39 and 49, respectively, and are, again, angled such that the reflected energy propagates along a direction for which the SAW phase velocity does not vary with temperature. The grooves of the middle array 73 are perpendicular to (a) a direction about which the SAW velocity varies symmetrically and (b) the resonator longitudinal axes 39 and 49. As a result, the angle of reflection of SAW energy off array 73 is equal to the angle of incidence, that angle being $\theta_4$ in each case. Thus, the energy reflected to output array 72 also propagates along a zero-temperature-coefficient direction. Array 72, again, is angled so as to reflect energy in a direction parallel to that from which it came, centered about longitudinal axis 49 of resonator 40.

When a U-path filter is configured as above for use as a track changer, unlike track changer 60, any deviation in the angle of reflection off array 71 results in a similar deviation in the angle of reflection off array 72 since, as previously noted, the incident and reflected angles are equal for array 73. As a result, energy leaving the track changer—although not assured to be centered on longitudinal axis 49 of resonator 40—is at least assured to be parallel thereto. This parallel offset will result in much less energy loss than if the energy enters the resonator at angle which, as previously discussed, is possible with track changer 60.

Three-bounce U-path filters have a combination of good potential filtering characteristics and good potential temperature stability. Filters with optimum characteristics for a given application would, however, generally incorporate specific intermediate path directions to provide the required temperature stability in the output beam and some sort of reflective array weighting scheme in one, two or all three arrays to provide the desired frequency response.

Figure 8:
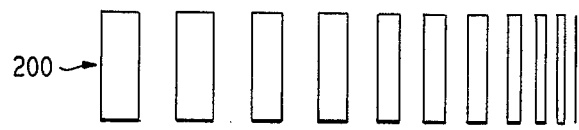
FIGS. 8–12 show, in pictorial form, several weighted reflective arrays.
Figure 9:
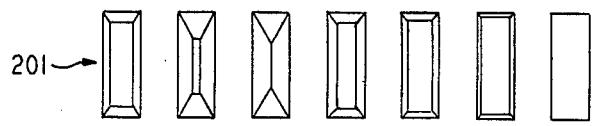
Figure 10:
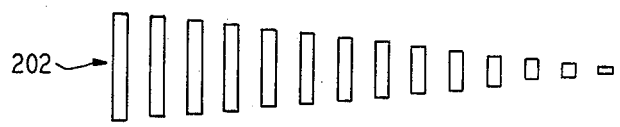
Figure 11:
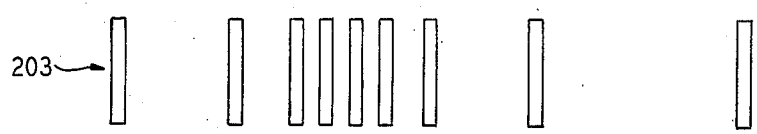
Figure 12:
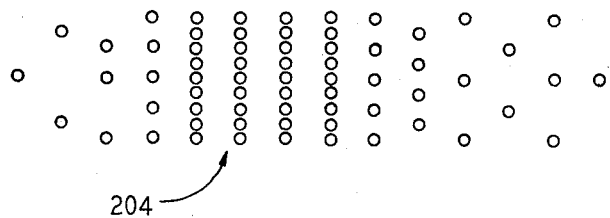

As is well known in the art, reflective array weighting, i.e., varying the reflectivity as a function of position within the distributed reflector array can be accomplished in a number of ways. The reflector elements, e.g. grooves, can be varied in line width and/or period (this is sometimes called position weighting), as is shown by 200 in FIG. 8. The reflector elements can also be varied in depth or thickness, as shown by 201 in FIG. 9 or varied in length, as shown by 202 in FIG. 10. Furthermore, reflective elements can also be selectively withdrawn, as shown by 203 in FIG. 11 or formed by variable density rows of dots typically termed a Reflected Dot Array (RDA), as shown by 204 in FIG. 12, to provide the desired change in local reflection strength along the array.

Figure 13:
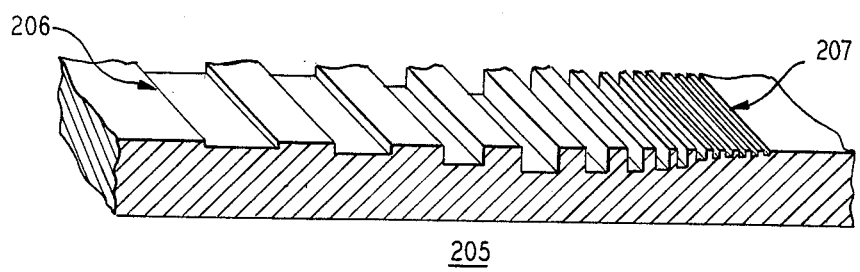
FIG. 13 shows, in pictorial form, the cross section of a reflective array utilizing a combination of some of the weighting embodiments shown in FIGS. 8–12.
Figure 14:
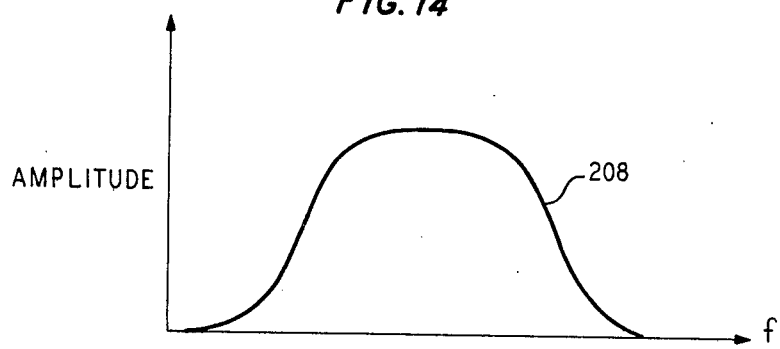
FIG. 14 shows a graph which pictorially displays the amplitude versus frequency for the array shown in FIG. 13.
Figure 15:
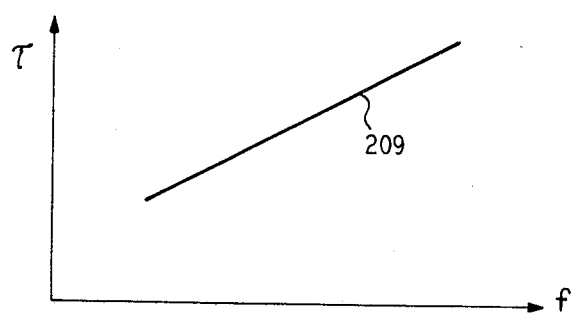
FIG. 15 shows a graph which pictorially displays the time delay versus frequency for the array shown in FIG. 13.

Combinations of weighting schemes are also commonly used. For example, consider pulse compression filters using a combination of position and depth weighting within the arrays, as shown by 205 pictorially in cross section in FIG. 13. Here long wavelengths are reflected most strongly at the end of the array denoted by 206 and short wavelengths more strongly at the end of the array denoted by 207. For waves incident from side 206 this weighting provides a longer reflection time delay for the high frequency wave. The depth weighting provides a desirable amplitude roll-off at the frequency extremes to yield optimized sidelobe responses and pulse shapes when used as a matched filter, i.e. the amplitude versus frequency response is as shown pictorially by 208 in FIG. 14 and the time delay response versus frequency response is as shown pictorially by 209 in FIG. 15.

In the three-bounce U-path filter one would most commonly weight arrays 71 and 72 equally and array 73 either not at all or perhaps differently.

FIG. 7 depicts a surface optical wave bandpass filter 80 embodying the principles of the present invention. In analogy to filter 20 of FIG. 1, filter 80 is disposed on substrate 85 on which optical waves guided along the surface will propagate. Substrate 85 may, for example, be comprised of LiNbO$_3$ with a surface layer depleted of oxygen or indiffused with various metals. (See for example, I. P. Kaminow, *IEEE MTT Trans.*, Vol. MTT-23, pp. 57–70, 1975.) A first grating resonator 90 disposed on substrate 85 is comprised of reflective gratings 92 and 93. A second grating resonator 95 is comprised of reflective gratings 97 and 98.

Gratings 92, 93, 97 and 98 are illustratively of the same type as gratings 32, 33, 42 and 43 of filter 20, the principal difference being a different line width and inter-line spacing, to account for the different wavelength of the optical energy.

Resonant energy in resonators 90 and 95 is coupled therebetween by way of track changer 100 which includes reflective arrays 101 and 102. These arrays, again, are illustratively the same type as their counterparts in track changer—arrays 51 and 52—except that the depth and spacing of the grooves of arrays 101 and 102 will be those appropriate to the optical frequency band in which the filter operates.

A minor difference between filters 20 and 80 is the manner in which energy is introduced into and removed therefrom. Input energy in surface optical wave form is introduced into resonator 90 via grating 92 which, unlike grating 32 in filter 20, is partially transmissive in the resonant band. (This input energy may be provided, for example, from another surface optical wave device (not shown) on substrate 85). Output energy, also in surface optical wave form, is provided via grating 97, which is also partially transmissive in the resonant band.

As illustrated in FIG. 7, the triangular regions 103 of arrays 101 and 102 may, if desired, be filled with grooves having the same spacing and depth as the full-length grooves thereof. The presence of these grooves in regions 103 helps preserve the energy profile, or "mode shape," of the resonant energy propagating through the track changer, thereby minimizing so-called "mode conversion" energy loss within the resonant passband. This expedient can be similarly employed in SAW track changer 50 of filter 20 as well as in track changers 60 and 70 of FIGS. 5 and 6. It will also be appreciated that although track changers 60 and 70 are described above in a SAW context, these configurations can be used at, for example, optical frequencies, as well, and thus could be used in place of track changer 100 in filter 80.

Although specific embodiments of the invention are shown and described herein, these merely illustrate the principles of the invention. Various other arrangements embodying these principles may be devised by those skilled in the art without departing from the spirit and scope of the invention.

I claim:

1. A grating resonator cascade comprised of
   a medium on which surface waves will propagate, and
   grating means disposed on said medium for forming first and second grating resonators for said surface waves, said resonators having respective longitudinal axes lying in different wave propagation tracks of said medium,
   characterized by means including means external to the cavities of said resonators for coupling a predetermined fraction of resonant wave energy in each resonator out of that resonator along its said axis and into the other resonator along its said axis.

2. The invention of claim 1 wherein said grating means is comprised of first and second pairs of reflective gratings each forming the cavity of an associated one of said resonators, said resonators being resonant within substantially the same resonant band and at least one grating of each of said pairs being partially transmissive within said band,
   said coupling means including said one grating of each of said pairs.

3. The invention of claim 2 wherein said medium is comprised of a material on which surface acoustic waves will propagate, said cascade being further comprised of means responsive to an electrical input signal for introducing surface acoustic wave energy into a selected one of said resonators.

4. The invention of claim 2 wherein said medium is comprised of a material on which surface optical waves will propagate.

5. The invention of claims 2, 3 or 4 wherein said external means is comprised of first and second means disposed on said medium, said first means being adapted to reflect at least a portion of the resonant wave energy coupled out of said first resonator to said second means and said second means being adapted to reflect at least a portion of the energy reflected thereto from said first means into said second resonator.

6. The invention of claim 5 wherein each of said gratings and each of said first and second means is substantially invisible to surface wave energy which is outside a predetermined grating stopband, said grating stopband encompassing said resonant band.

7. The invention of claim 6 wherein said medium is comprised of a crystalline material for which the phase velocity of said surface waves is substantially temperature invariant in at least one direction with respect to the crystal axes of said material, and wherein said first means is disposed on said medium such that the energy reflected thereby to said second means propagates in said direction.

8. The invention of claim 7 wherein each of said first and second means is comprised of at least a first respective region of said medium in which a plurality of substantially parallel grooves is formed.

9. The invention of claims 2, 3 or 4 wherein said external means is comprised of first, second and third means disposed on said medium, said first means being adapted to reflect at least a portion of the resonant wave energy coupled out of said first resonator to said third means, said third means being adapted to reflect at least a portion of the energy reflected thereto from said first means to said second means, and said second means being adapted to reflect at least a portion of the energy reflected thereto from said third means into said second resonator.

10. The invention of claim 9 wherein said third means is disposed on said medium such that energy incident on said third means is reflected off said third means at an angle equal to the angle of incidence.

11. The invention of claim 10 wherein each of said first, second and third means is comprised of a respective region of said medium in which a plurality of substantially parallel grooves is formed.

12. A surface wave device comprising
a substrate on which energy in the form of surface waves will propagate,
first and second pairs of reflective gratings disposed on said substrate, said gratings defining first and second resonating cavities in respective first and second wave propagation tracks on said substrate, said cavities being resonant in a predetermined frequency band and at least one grating of each of said pairs being partially transmissive to frequencies within said band,
characterized by track changer means external to said cavities for directing wave energy within said band which propagates through said one grating of each of said pairs into said one grating of the other of said pairs.

13. The invention of claim 12 wherein said track changer means includes first and second reflective arrays disposed in said first and second tracks, respectively, said first array being adapted to reflect energy in said first track to said second array, and said second array being adapted to reflect energy received from said first array into said second track.

14. The invention of claim 13 wherein each of said gratings and each of said arrays is substantially invisible to surface wave energy outside a predetermined grating stopband, said grating stopband encompassing said resonant band.

15. The invention of claims 12, 13 or 14 wherein said substrate is comprised of a material on which surface acoustic waves will propagate, said device further comprising means disposed in said first cavity for launching surface acoustic wave energy therein in response to an electrical input signal and means disposed in said second cavity for generating an electrical output signal in response to surface acoustic wave energy therein.

16. The invention of claim 15 further comprising surface acoustic wave electromechanical coupler means disposed on said substrate for coupling a selected portion of the energy within said band in each of said cavities into the other of said cavities.

17. A U-path filter comprised of:
a medium on which surface waves will propagate; and
reflecting means disposed on said medium for reflecting at least a portion of said surface waves;
characterized in that
said reflecting means comprises first, second and third reflecting means for reflecting said surface waves disposed such that a portion of said surface waves incident in a first direction upon said first means is reflected onto said second reflecting means and a portion of said reflected surface waves is further reflected onto said third reflecting means and a portion of said further reflected surface waves are once again reflected by said third reflecting means so as to travel in substantially the opposite direction from said first direction.

18. The U-path filter as defined in claim 17 wherein said first reflecting means is disposed such that the reflected portion of surface waves incident thereon along said first direction for which the surface wave phase velocity does not vary substantially with temperature travels along a second direction for which the surface wave phase velocity does not vary substantially with temperature;
said second means is disposed such that a normal to the effective reflecting surface of said second means is parallel to said first direction and a direction about which the surface wave velocity varies symmetrically, whereby the reflected portion of the surface waves incident thereon along said second direction travels along a third direction for which the surface wave phase velocity does not vary substantially with temperature; and
said third means is disposed such that the reflected portion of surface waves incident thereon along said third direction travels opposite said first direction.

19. The U-path filter as defined in claim 17 wherein said medium is comprised of a material on which surface optical waves will propagate.

20. The U-path filter as defined in claim 17 wherein said medium is comprised of a material on which surface acoustic waves will propagate.

21. The U-path filter as defined in claim 17 wherein at least one of said reflecting means are weighted.

22. The U-path filter as defined in claim 21 wherein said first reflecting means and said second reflecting means are weighted.

* * * * *